United States Patent
Choi et al.

(10) Patent No.: US 11,309,048 B2
(45) Date of Patent: Apr. 19, 2022

(54) MEMORY TEST APPARATUS AND TESTING METHOD THEREOF INCLUDING BUILT-IN SELF TEST (BIST)

(71) Applicant: Samsung Electronics Co., Ltd., Suwon-si (KR)

(72) Inventors: Hong-Mook Choi, Bucheon-si (KR); Hye Soo Lee, Yongin-si (KR); Ji-Su Kang, Seoul (KR); Hyun Il Kim, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/027,007

(22) Filed: Sep. 21, 2020

(65) Prior Publication Data
US 2021/0249096 A1   Aug. 12, 2021

(30) Foreign Application Priority Data
Feb. 11, 2020 (KR) .......................... 10-2020-0016200

(51) Int. Cl.
| | |
|---|---|
| *G11C 29/18* | (2006.01) |
| *G11C 29/10* | (2006.01) |
| *G06F 9/448* | (2018.01) |
| *G11C 7/10* | (2006.01) |
| *G11C 16/14* | (2006.01) |
| *G11C 29/50* | (2006.01) |

(52) U.S. Cl.
CPC ............ *G11C 29/18* (2013.01); *G06F 9/4498* (2018.02); *G11C 7/1012* (2013.01); *G11C 16/14* (2013.01); *G11C 29/10* (2013.01); *G11C 29/50016* (2013.01)

(58) Field of Classification Search
None
See application file for complete search history.

(56) References Cited

U.S. PATENT DOCUMENTS

| | | | | |
|---|---|---|---|---|
| 5,675,545 A | * | 10/1997 | Madhavan | ............. G11C 29/12 365/201 |
| 6,175,524 B1 | * | 1/2001 | Kwak | .................... G11C 29/38 365/189.05 |

(Continued)

FOREIGN PATENT DOCUMENTS

| | | |
|---|---|---|
| JP | 2005164265 A | 6/2005 |
| JP | 2019114244 A | 7/2019 |
| KR | 101963811 B1 | 3/2019 |

OTHER PUBLICATIONS

Banerjee, Shibaji, et al., "Built-In Self-Test for Flash Memory Embedded in SoC", Proceedings of the Third IEEE International Workshop on Electronic Design, Test and Applications (DELTA'06), Jan. 17-19, 2006, 1-6.

*Primary Examiner* — J. H. Hur
(74) *Attorney, Agent, or Firm* — Myers Bigel, P.A.

(57) ABSTRACT

A method of testing using a memory test apparatus connected to a memory device includes receiving a test command. When the test command is a finite state machine (FSM) operation command, the memory device is tested in accordance with the FSM operation command, and an operation is performed to output a result depending on a pass/fail result. But, when the test command is a direct access command, an auto-operation test of input data is performed in a test region according to received address information, and a test result is output, which may include output data with fail information or the auto-operation.

16 Claims, 5 Drawing Sheets

(56) References Cited

U.S. PATENT DOCUMENTS

| | | | |
|---|---|---|---|
| 6,351,837 B1 * | 2/2002 | Huang | G11C 29/16 |
| | | | 714/724 |
| 6,424,583 B1 | 7/2002 | Sung et al. | |
| 6,631,086 B1 * | 10/2003 | Bill | G11C 29/16 |
| | | | 365/185.09 |
| 6,651,201 B1 | 11/2003 | Adams et al. | |
| 6,658,611 B1 * | 12/2003 | Jun | G11C 29/16 |
| | | | 714/719 |
| 6,941,499 B1 | 9/2005 | Sung et al. | |
| 8,934,311 B2 | 1/2015 | Yu et al. | |
| 10,311,964 B2 | 6/2019 | Wu et al. | |
| 2010/0017664 A1 | 1/2010 | Jang | |
| 2014/0258780 A1 | 9/2014 | Eyres | |
| 2017/0045579 A1 | 2/2017 | Leung | |
| 2019/0295680 A1 * | 9/2019 | Anzou | G06F 11/1052 |

\* cited by examiner

FIG. 9
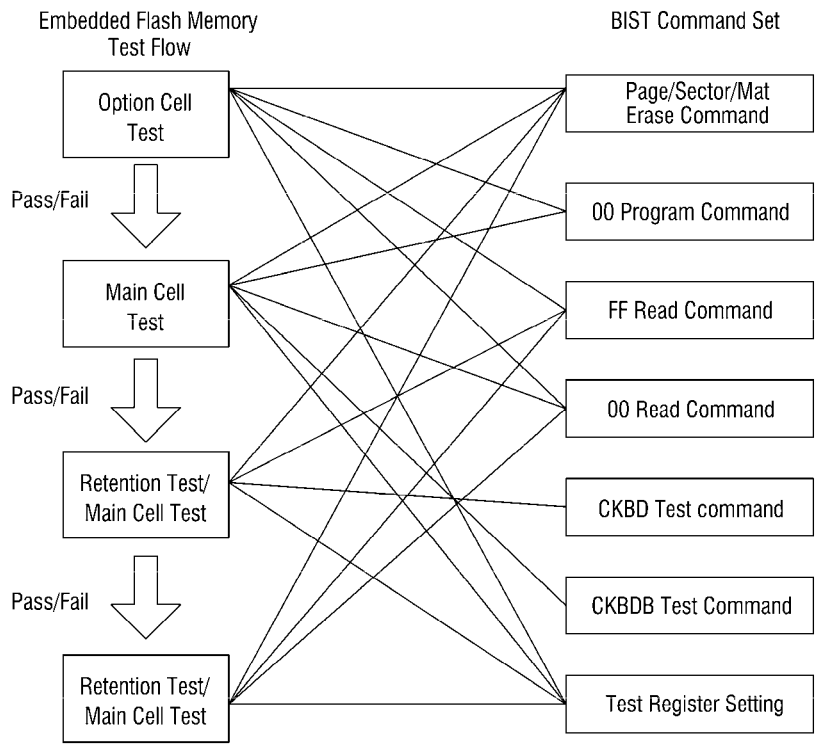
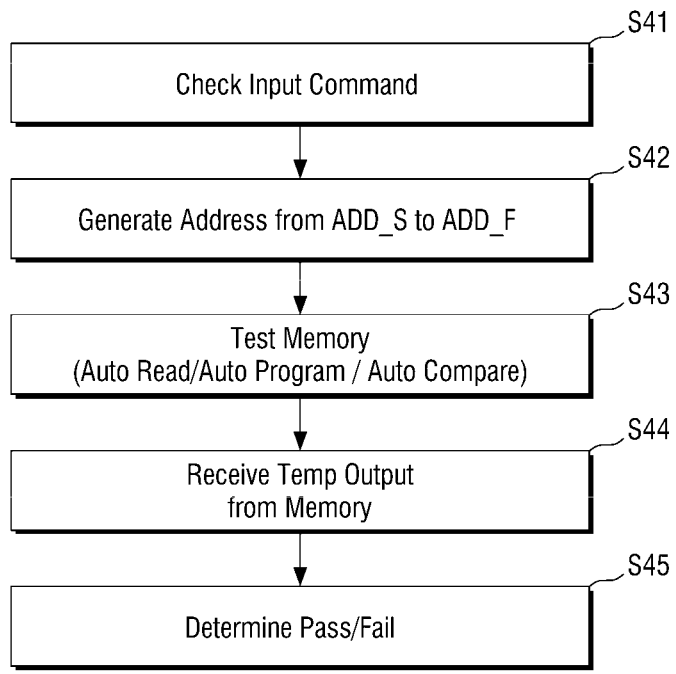
FIG. 10

MEMORY TEST APPARATUS AND TESTING METHOD THEREOF INCLUDING BUILT-IN SELF TEST (BIST)

REFERENCE TO PRIORITY APPLICATION

This U.S. nonprovisional application claims priority under 35 U.S.C. § 119 to Korean Patent Application No. 10-2020-0016200, filed Feb. 11, 2020, the disclosure of which is hereby incorporated herein by reference in its entirety.

BACKGROUND

1. Field of the Invention

The present invention relates to a memory test apparatus and a testing method for testing defects of a highly integrated memory device.

2. Description of the Related Art

State of the art semiconductor chips are often designed and fabricated using DSM (Deep Sub-Micron) technologies, and as memories become more and more embedded, lower memory yield has had a significant impact on overall device yield. Accordingly, repairable memory is being utilized to improve overall chip yield.

In addition, as the degree of integration of semiconductor devices increases and the functions become more complicated, several methods for efficiently testing the semiconductor devices are being studied. In particular, a method called BIST, which stands for: Built-In Self Test, has been considered for efficiently testing memories, which are embedded within semiconductor devices. This method for testing embedded memories may use a circuit in which a memory test algorithm is implemented.

SUMMARY

Aspects of the present invention provide a memory test circuit, a test system, and an operating method thereof with improved testability and debugging capability.

Aspects of the present invention also provide a memory test circuit, a test system and an operating method thereof which can be tested at low cost.

One aspect of the present invention is to provide a testing method of a memory test apparatus connected to a memory device, the testing method includes receiving a test command, and when the test command is a finite state machine (FSM) operation command, then testing the memory device in accordance with to the FSM operation command, and outputting a result depending on pass/fail. However, when the test command is a direct access command, executing an auto-operation test of input data in a test region according to received address information and outputting a test result, the test result including output data of fail information or the auto-operation.

Another aspect of the present invention provide a memory test apparatus connected between automatic test equipment and a memory device includes a test interface which receives a test command from the automatic test equipment and returns a test result and a built-in self test (BIST) module which accesses the memory device and executes a test. When the test command is a finite state machine (FSM) operation command, the BIST module autonomously generates an address in accordance with the FSM operation command, accesses the memory device, and executes a test procedure. And, when the test command is a direct access command, the BIST module executes an auto-operation test on a test region of the memory device on received address information.

Other aspects of the present invention provide a memory test apparatus, which includes a test interface which receives test commands from automatic test equipment and outputs a test result and a BIST module which is connected to a memory device, executes at least one test procedure on entire regions of the memory device on the basis of the test command or executes an auto-operation test on a test region specified by the memory device through the automatic test equipment and outputs test results.

However, aspects of the present invention are not restricted to the one set forth herein. The above and other aspects of the present invention will become more apparent to one of ordinary skill in the art to which the present invention pertains by referencing the detailed description of the present invention given below.

DETAILED DESCRIPTION OF THE DRAWINGS

FIG. 9 is a conceptual diagram for explaining the procedure of the testing method according to some embodiments.

FIG. 10 is a flowchart for explaining the testing method according to some embodiments.

DETAILED DESCRIPTION OF THE EMBODIMENTS

Hereinafter, embodiments according to the technical idea of the present invention will be described with reference to the accompanying drawings.

Figure 1:
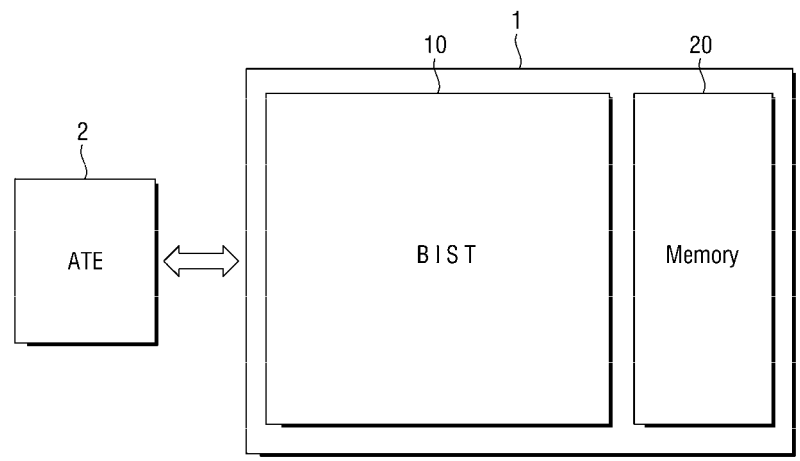
FIG. 1 is a block diagram for explaining a memory test apparatus according to some embodiments of the present invention.
Figure 2:
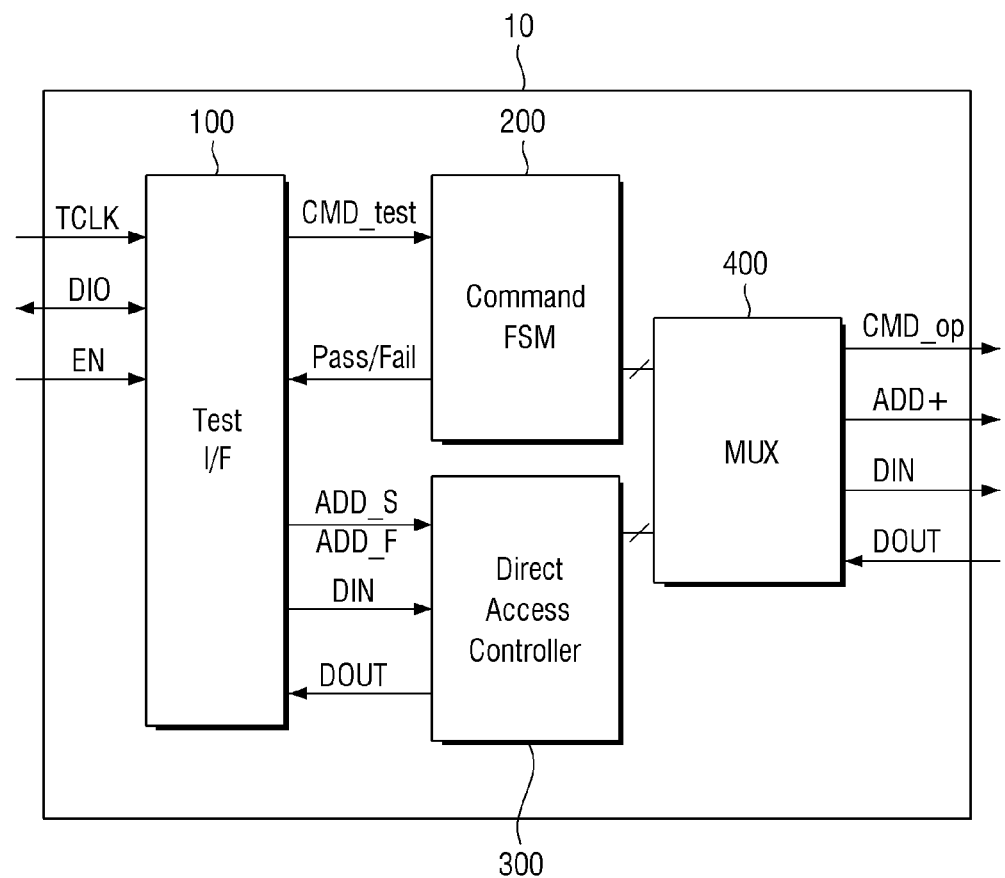
FIG. 2 is a block diagram for explaining a BIST module of FIG. 1.
Figure 3:
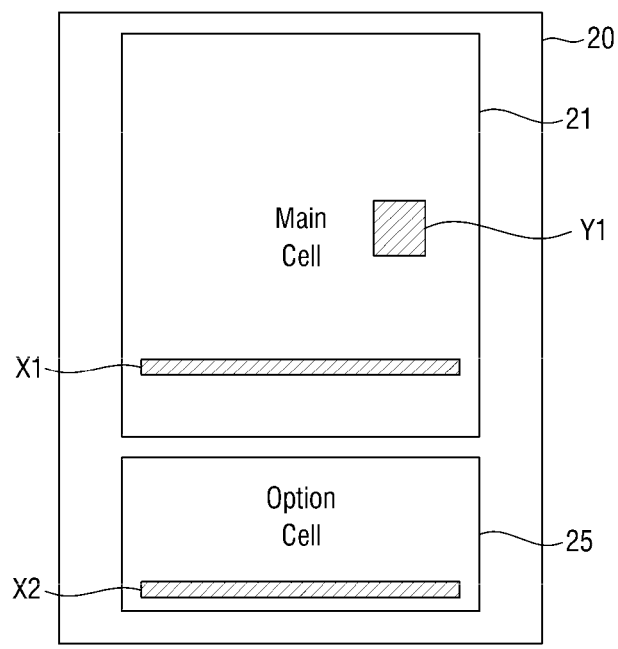
FIG. 3 is a block diagram for explaining the memory device of FIG. 1.

FIG. 1 is a block diagram for explaining a memory test apparatus according to some embodiments of the present invention, FIG. 2 is a block diagram for explaining a BIST module of FIG. 1 in detail, and FIG. 3 is a block diagram for explaining the memory device 20 of FIG. 1 in detail. Referring to FIG. 1, a memory test apparatus 1 according to some embodiments of the present invention is connected to automatic test equipment 2, and includes a BIST module 10 and a memory device 20.

The automatic test equipment (ATE) 2 is a device that automatically tests at least one device under test (DUT), and may test whether the memory device 20 is defective, by applying a stimulus signal to the memory test apparatus 1 as the device under test and inspecting a response signal (Pass/Fail) to the stimulus signal.

The ATE 2 may be connected to an external server, using an interface. The server may provide a user interface to provide an environment in which the user may create a test program suitable for the characteristics of the device under test to be tested. Further, the server transmits the test program to the ATE 2, and may provide a user interface that may receive and analyze the test results at the ATE 2. The server may be any type of processing device, and may include, but is not limited to, a conventional personal computer, a desktop device, a portable device, a microprocessor computer, a microprocessor-based or programmable consumer electronic device, a mini-computer, a main frame computer, and/or a personal mobile computing device.

The memory test apparatus 1 is a built-in self test circuit (BIST), and may be a device which is designed so that it may drive the test program transmitted from the ATE 2. The test program may be made up of commands for executing a test operation in the memory test apparatus 1. This memory test apparatus 1 may receive the stimulus signal, execute a test of the memory device 20, and output the test result to the ATE 2. The stimulus signal may include test commands and parity information, according to some embodiments. The stimulus signal may further include address information, according to some embodiments, and may include data according to further embodiments.

Referring to FIG. 2, the BIST module 10 may include a test interface 100, a command FSM module 200, a direct access controller 300 and a multiplexer 400.

The test interface 100 electrically connects the ATE 2 and the memory test apparatus 1 to receive a stimulus signal and output a response signal. The test interface 100 may be formed of a plurality of conductive patterns according to some embodiments, and may include input/output test signal lines, clock signal lines TCLK, and power supply lines according to various embodiments.

The stimulus signal transmitted from the ATE 2 according to some embodiments may include a test command EN of the memory device 20. The test command EN may include a test command on which test operation to be executed. According to some embodiments, the test commands may include a command FSM operation command and a direct access command.

In addition, according to some embodiments, the stimulus signal may further include address information of a test region designated by the ATE 2. In this case, the address information of the test region means a start address ADD_S and an end address ADD_F. According to some embodiments, the stimulus signal may further include data DATA in accordance with the test command. According to an embodiment, the memory test apparatus 1 may program the data DATA included in the stimulus signal into the memory device 20 in accordance with the test command CMD_test. According to another embodiment, the memory test apparatus 1 uses the data DATA included in the stimulus signal as a target data, and may compare it with the data read by the memory device 20 in accordance with the test command CMD_test.

According to some embodiments, the test interface 100 checks whether the test command CMD_test is an FSM operation command or a direct access command, and may transmit the test command to that module in accordance with the checked result. Specifically, if the test command received by the ATE 2 is an FSM operation command, then the test interface 100 may transmit the test command to the command FSM module 200. In response, the test interface 100 may return the test result according to the FSM operation command, that is, pass/fail, to the ATE 2. However, if the test command received by the ATE 2 is a direct access command, then the test interface 100 may transmit the test command to the direct access controller 300. In this case, according to an embodiment, the test interface 100 may return the result of the auto-operation test, that is, pass/fail, to the ATE 2. Alternatively, according to another embodiment, the test interface 100 may also return the output data DOUT generated as a result of the auto-operation test to the ATE 2.

The command FSM module 200 may repeatedly perform the operation defined as a test procedure on the memory device 20. Specifically, since the command FSM module 200 may autonomously generate an address for accessing the memory device 20 during the execution of the test procedure, it is possible to execute the test operation without entering another address. Further, since the command FSM module 200 stores the data pattern, it executes the test, without setting the input data separately for the ATE 2. Therefore, when testing with the FSM operation command, since the automatic test equipment 2 checks only the test result according to a preset test procedure, it is possible to lower the dependence on the automatic test equipment 2 and reduce the number of commands or data to be input and the test time. In other words, if the command FSM module 200 receives the FSM operation command, it may access the memory device and execute at least one test procedure in accordance with the FSM operation command.

The command FSM module 200 may include a finite state machine (FSM) according to some embodiments, and the finite state machine may include at least one test procedure. The test procedure in this specification refers to a command set including at least two or more operation commands CMD_op.

The command set is a command set which executes the first operation command CMD_op of at least one cell included in the memory device 20, and includes at least one second operation commands CMD_op determined as a next operation to be executed on the basis of the execution result of the cell. That is, the command set refers to the order of commands determined on the basis of the execution result of the previous command. The test procedure will be more specifically described in FIGS. 8 to 9.

When the direct access controller 300 receives the direct access command from the ATE 2, the direct access controller 300 may execute the auto-operation of the test region designated by the ATE 2. In this case, the ATE 2 may transmit address information or test data of the test region together. The direct access controller 300 may include a test to be executed with commands not set as the test procedure of the finite state machine or a test of a particular region set by ATE 2 or a suspected defective region. Testing of the suspected defective region may include, for example, a test for programming or reading predetermined test data, or a test for reading data programmed in a test region in the memory device 20 and comparing it with target data.

According to some embodiments, the auto-operation test may include an auto-program operation for programming the same preset data for each memory cell of the test region, and an auto-erase operation for erasing data of the test region, an auto-read operation for read data stored in the memory cells of the test region, and an auto-compare operation for comparing the data read from the memory cells of the test region with the target data received from the ATE 2 to output comparison results.

As an example, the data programmed at the time of the auto-program operation may be data received by the ATE 2 according to some embodiments, and may be a data pattern according to other embodiments. For example, the target data at the time of the auto-compare operation may be data DATA received by the ATE 2 according to some embodiments.

When the multiplexer 400 receives an operation command CMD_op, access address ADD+, and data DIN from the command FSM module 200 or the direct access controller 300, the multiplexer 400 outputs them to the memory device 20. The memory device 20 executes an operation according to the operation command CMD_op in the memory cell corresponding to the access address ADD+, and returns the execution result to the multiplexer 400. The execution result may include data DOUT according to the operation command CMD_op in addition to the completion signal.

Referring to FIG. 3, the memory device 20 includes a test region. In the case of the FSM operation command, the test region may be the entire region of the memory device 20 according to an embodiment, or a partial region of the memory device 20 according to another embodiment. In the case of the partial region, the test region may be a region from the start address to the end address set in the test procedure of the FSM module 200. The partial region may be a region according to an access unit of the memory device 20.

In the case of the direct access command, the test region may be a partial region of the memory device 20 according to some embodiments. According to an embodiment, a partial region may be the address information received from the ATE 2, that is, the region from the start address to the end address. According to another embodiment, a partial region may include memory cells of a region adjacent to the suspected defective region Y1. According to still another embodiment, a partial region may be narrow region other than access units of the memory device 20, such as pages or block units.

The memory device 20 may include a main cell region 21 and an option cell region 25. Normally, data is programmed, read, and erased in the memory cells of the main cell region 21. If any memory cell of the main cell region 21 is defective, the memory cell of the option cell region 250 may be used to replace the defective cell according to the debugging.

More specifically, the memory device 20 may be erased in memory access units, such as memory block units, programmed in page units, and read in cell units. Considering such command execution units, if any cell in the main cell region 21 is defective, the page or block X1 including the defective cell may not be usable due to the defect. In this case, the memory device 20 may be replaced with page or block X2 of the option cell region, instead of the page or block X1 including the defective cell in the main cell region through debugging.

According to some embodiments, the memory device 20 updates the address information replaced by the debugging to FTL (File Transfer Layer), and the BIST module 10 may execute the test operation on the memory cell of the replaced address. Also, according to some embodiments, the BIST module 10 may output the test result, including the debugging result including the replaced address information, to the ATE 2.

According to some embodiments, the memory device 20 may be a volatile memory element such as a SRAM, a DRAM and a SDRAM, or a nonvolatile memory element such as a ROM, a PROM, an EPROM, an EEPROM, a NAND flash memory device, a NOR flash memory device, a resistance-change memory device (RRAM), a phase-change memory device (PRAM), a magneto resistive memory device (MRAM) and a ferroelectric memory device (FRAM), and a memory component including them. Also, the memory device 20 is not limited to a memory element or a memory package, and may be, for example, a memory module, a memory card or a memory stick formed by combining the memory components.

Figure 4:
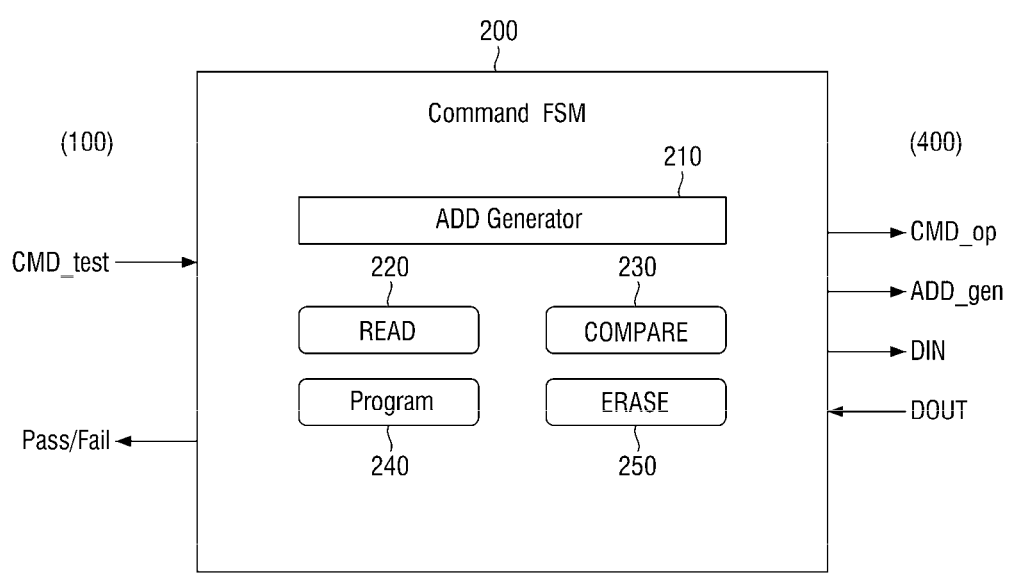
FIG. 4 is a block diagram for explaining the command FSM module of FIG. 2.
Figure 5:
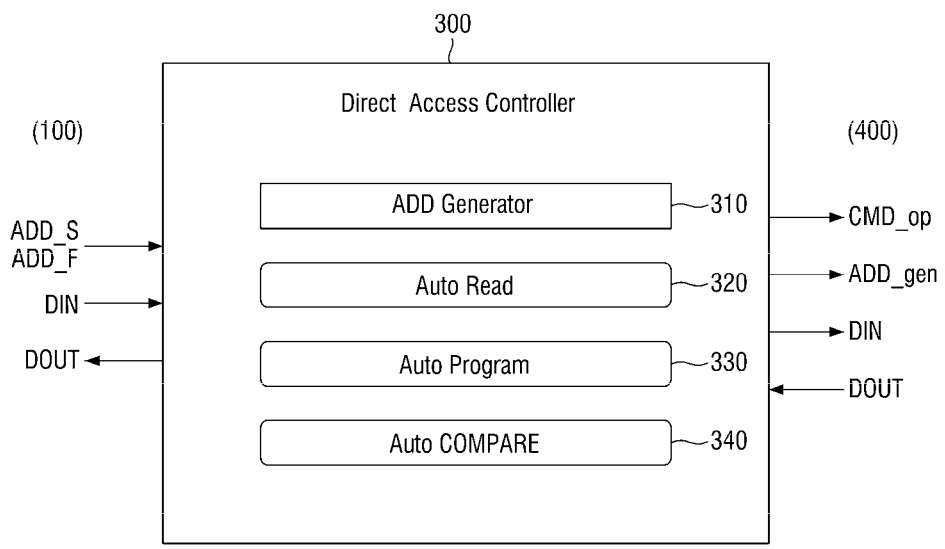
FIG. 5 is a block diagram for explaining the direct access controller of FIG. 2.
Figure 6:
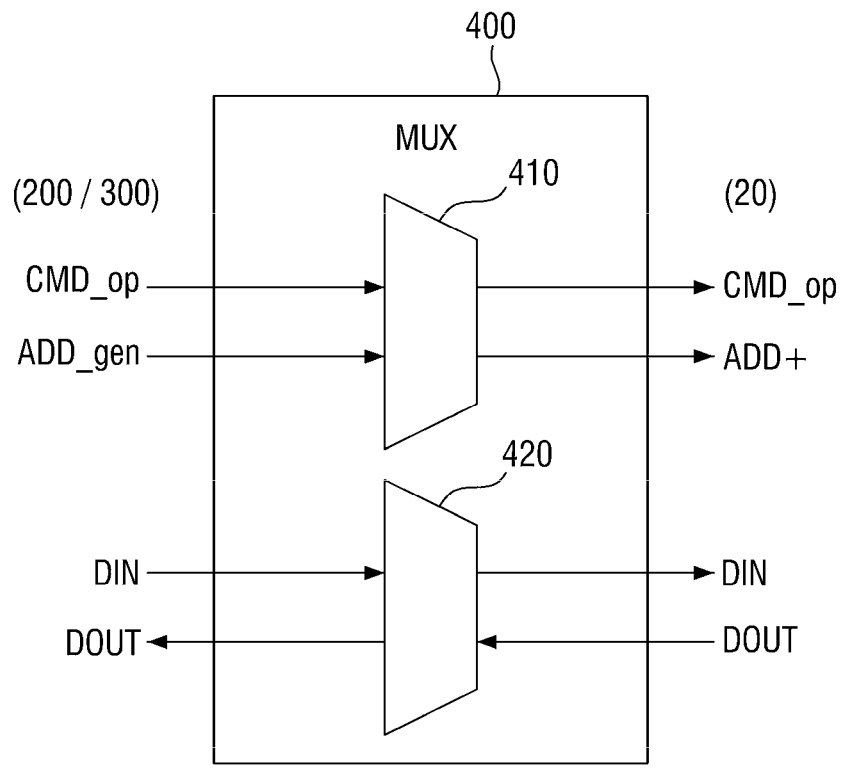
FIG. 6 is a block diagram for explaining the multiplexer of FIG. 2.

FIG. 4 is a block diagram for explaining the command FSM module of FIG. 2 in detail, and FIG. 5 is a block diagram for explaining the direct access controller of FIG. 2 in detail. FIG. 6 is a block diagram for explaining the multiplexer of FIG. 2 in detail. Referring to FIG. 4, the command FSM module 200 may include a first address generator 210, operation modules 220, 240 and 250 and a compare module 230. The first address generator 210 generates an access address for accessing the test region.

According to some embodiments, the first address generator 210 may autonomously generate an access address up to the end address by increasing or decreasing the address index from the start address on the entire region of the memory device 20. At this time, an access address on the option cell region may be generated or an access address on the main cell region may be generated, in accordance with the test procedure to be executed by the command FSM module 200.

According to some embodiments, the first address generator 210 may also generate an access address on a partial region that is set by the test procedure. At this time, the partial region may be at least a part of the main cell region according to an embodiment, and may be at least a part of the option cell region according to another embodiment.

The operation modules 220, 240 and 250 may execute program, read or erase of the data on the memory cell corresponding to the access address ADD_gen generated by the first address generator 210 according to the test procedure. This test procedure may include at least one operation command as an operation command set of a preset sequence. A more specific description will be given in FIGS. 8 and 9.

According to some embodiments, when the read operation module 220 is enabled according to the preset sequence, it may read the data DOUT stored in the memory cells of the test region. The read data may be stored in a test register (not shown). According to some embodiments, when the program operation module 240 is enabled according to the preset sequence, it may program the data DIN into the memory cells of the test region. At this time, the data DIN to be programmed may be the data DATA received from the ATE 2 according to an embodiment, or may be data pattern received from the ATE 2 according to another embodiment. According to some embodiments, when the erase operation module 250 is enabled according to the preset sequence, it may erase the data of the memory cells of the test region.

The compare module 230 may compare the data read from the memory cell corresponding to the access address with the target data, and output the comparison result as a test result. The test register may store the target data and the read data, and the compare module 230 may compare both data. If the read data matches the target data, the compare module 230 may re-enable the read operation module 220 to perform re-read, and if the re-read data does not match the target data, the compare module 230 may execute debugging.

As described above, the debugging is performed by replacing a part of the main cell region X1 with a part of the option cell region X2 and remapping it, and may store remapping information in the FTL (File Transfer Layer) of the memory device 20 and the test register. The remapping information may include debugging count and address information debugged cell according to some embodiments.

According to an embodiment, the comparison result of the compare module 230 includes at least one of match or mismatch with the target data, whether to debug when there is a mismatch, and the address information of the cells when there is a mismatch. The test register may store the comparison result. That is, the ATE 2 may check the presence or absence of a defect of the memory device 2 and the position of the defect, according to the comparison result of the compare module 230.

As an example, if debugging exceeds the preset number of times, the compare module 230 determines that the debugged memory fails and may output a test result. At this time, the test result may include address information of the memory cell on which the debugging is executed.

Referring to FIG. 5, the direct access controller 300 may include a second address generator 310, an auto-read module 320, an auto-program/erase module 330 and an auto-compare module 340. The second address generator 310 may generate an access address ADD_gen on the memory cell of the test region. According to some embodiments, the access address ADD_gen may be generated by increasing or decreasing the address index from the start address ADD_S to the end address ADD_F on the basis of the address information received from the ATE 2.

The address information received from the ATE 2 may be address information of only the suspected defective region Y according to an embodiment, and may be address information of a wide region including the suspected defective region Y according to another embodiment. Alternatively, according to some embodiments, the access address ADD-_gen may set the test region, by increasing or decreasing the address index to the adjacent region on the basis of the address information of the suspected defective region Y received from the ATE 2.

At least one of the auto-read module 320, the auto-program/erase module 330, and the auto-compare module 340 may be enabled and operated on the basis of the direct access command CMD_test or the enable signal. The auto-read module 320 may read the data stored in the memory cell corresponding to the access address. The auto-program/erase module 330 may automatically program the same data in the memory cell corresponding to the access address, or may automatically erase the programmed data.

The auto-compare module 340 may compare the data read for each memory cell corresponding to the access address with the target data and output the comparison result. As a result of the comparison, if the data is the same as the target data, the auto-compare module 340 may output Pass, and if the data is not the same as the target data, the auto-compare module 340 may output Fail to the ATE 2 as a test result through the test interface 100.

Referring to FIG. 6, the multiplexer 400 may include a first multiplexer 410 and a second multiplexer 420. The first multiplexer 410 outputs the operation command CMD_op and the access address ADD_gen received by the command FSM module 200 or the direct access controller 300 to the memory device 20 to execute the operation according to the operation command CMD_op in the memory cell corresponding to that access address ADD+ of the memory device 20. The second multiplexer 420 outputs and programs the data DIN received by the command FSM module 200 or the direct access controller 300 to the memory device 20, or receives the data DOUT read by the memory device 20 and transmits it to the command FSM module 200 or the direct access controller 300.

Figure 7:
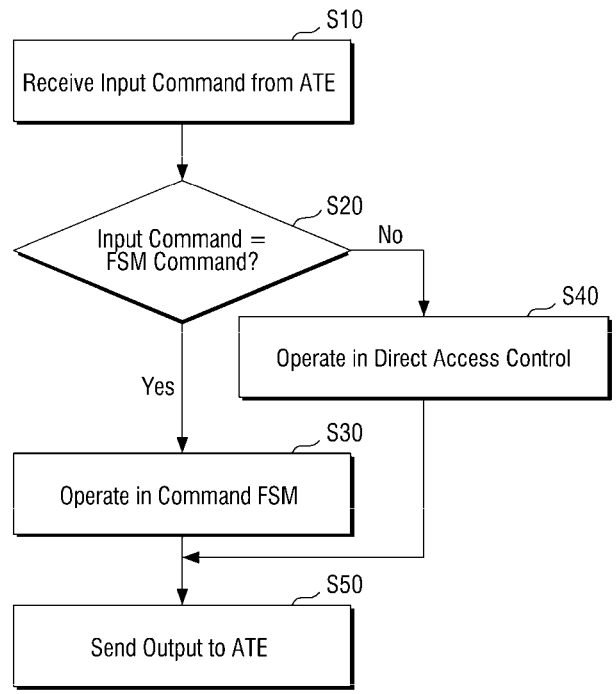
FIG. 7 is a flowchart for explaining a testing method according to some embodiments of the present invention.
Figure 8:
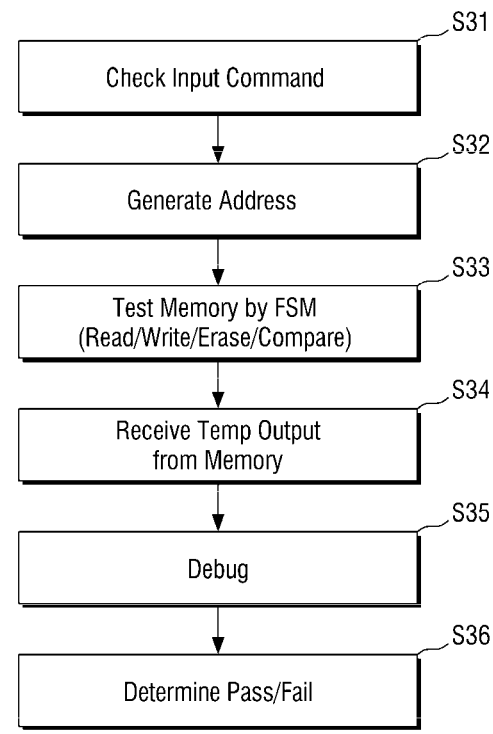
FIG. 8 is a flowchart for explaining a testing method according to some embodiments.

FIG. 7 is a flowchart for explaining a testing method according to some embodiments of the present invention, and FIG. 8 is a flowchart for explaining a testing method according to some embodiments. FIG. 9 is a conceptual diagram for explaining the procedure of the testing method according to some embodiments. FIG. 10 is a flowchart for explaining the testing method according to some embodiments.

According to the testing method according to some embodiments, the memory test apparatus receives a test command from the automatic memory device (S10). The memory test apparatus checks whether the received test command (Input Command) is a FSM operation command or a direct access command (S20). As an example, if the received test command is an FSM operation command, the memory test apparatus tests the test region in accordance with the FSM operation command (S30, S31).

Referring to FIG. 8, an access address for accessing the memory device is generated (S32). The access region according to the FSM operation command may be the entire region of the memory device according to an embodiment, or may be a partial region of the memory device according to another embodiment. The access region may be all or a part of the main cell region of the memory device according to some embodiments, and may be all or a part of the option cell region of the memory device according to some embodiments.

The memory test apparatus may execute at least one test procedure on the basis of the operation command of the FSM to test the test region (S33). The FSM operation command may include a test procedure of the option cell region, a test procedure of the main cell region, and a retention test procedure of the main cell region according to some embodiments. The memory test apparatus includes a finite state machine, and the finite state machine includes at least one test procedure, and may include at least two or more operation command sets to be executed in a preset sequence in accordance with at least one test procedure.

The test procedure of the option cell region according to some embodiments may be at least one of execution of the erase operation for each page or for each sector in the option cell region, programing of data in the option cell region, and reading of data programmed in the option cell region. Also, the test procedure of the option cell region may store the test result in the test register after execution of the aforementioned operation.

The test procedure of the main cell region according to some embodiments may include at least one of execution of erase operation for each page or for each sector in the main cell region, programming of the preset data in the main cell region, reading of the data programmed in the main cell region, comparison of whether the read data is the same as the target data, and execution of the test on the main cell region with a data pattern or an inverted data pattern. Further, the test procedure of the main cell region may store test result in the test register.

A retention test procedure of the main cell region according to some embodiments is a test command executed after a retention operation of the memory device. More specifically, the retention test procedure may be at least one of reading of data from the main cell region, comparison of whether the read data is the same as the target data, and execution of a test in the main cell region with a data pattern or an inverted data pattern. In addition, the retention test procedure may store the test result in the test register.

The procedure will be described more specifically referring to FIG. 9. As an exemplary embodiment, first, a test may be performed on the option cell region, while accessing each cell through an access address. The erase operation is first executed on at least one cell of the option cell region, for each operation unit (Page/Sector/Mat), and an operation command to be executed next is determined according to the erase execution result.

If the erase execution result is pass, the data "00" is programmed in that cell of the option cell region, and the data "FF" is programmed. As the program execution result, the data "00" is read from the cell, and the test results according to the program operation and the read operation as the read execution result are stored in the test register. If the read data stored in the test register and the target data match, it is possible to determine that the cell of the option cell region passes. If it is determined that all the cells of the option cell range pass, the test is executed by accessing one of the cells in the main cell region through the access address.

First, an erase operation is executed on at least one cell of the main cell region for each operation unit (Page/Sector/Mat), and the operation command to be executed next is determined according to the erase execution result. If it is the erase execution result passes, the data "00" is programmed in the cell of the option cell region. After the program is executed, the data "00" is read again from that cell, and the test result according to the read operation is stored in the test register. If the read data stored in the test register and the programmed data match as "00", the inverted data pattern CKBDB test is performed on that cell. The result of execution of the data pattern test is stored in the test register.

When it is determined that the execution result of the data pattern test stored in the test register passes, the retention is applied to the main cell region. After executing the erase operation on the retention main cell region for each operation unit (Page/Sector/Mat), the data "FF" is read, the data pattern test CKBD is executed, the execution result is stored in the test register. In this way, the operation command to be executed in the next step may be variously changed on the basis of the execution result of the previous operation command, and the memory device may execute the test with the operation command set variously recombined by the test procedure without intervention of the automatic test equipment. However, the scope is not limited to the embodiment shown in FIG. 9, and various test procedures may be changed and applied depending on the design.

The memory test apparatus may store the temporary test result according to the test procedure in the test register (S34). The temporary test result may include whether the test is completed, whether the test is pass/fail, and whether there is a defect in a predetermined memory cell. If at least one cell of the memory device is suspected to be defective, the memory test apparatus may perform debugging (S35). The case whether the defect is suspected is a case where the data read from a predetermined memory cell does not match the target data when compared, and debugging may be performed.

As described above, debugging is performed by replacing a part X1 of the main cell region with a part X2 of the option cell region and remapping it, and remapping information may be stored in the FTL (File Transfer Layer) and test register of the memory device. The remapping information may include debugging count and address information of the debugged cell according to some embodiments. According to an embodiment, the temporary test results stored in the test register may be updated with test results after the debugging. The test result to be transmitted to the automatic test equipment may include at least one of match or mismatch with the target data, whether to debug at the time of mismatch, and the address information of the cell at the time of a mismatch. Therefore, the automatic test equipment may easily check the presence/absence of a defect of the memory device and the position of the defect according to the test procedure (S36). As an example, if the received test command is a direct access command, the memory test apparatus tests the test region in accordance with the direct access command (S40, S41).

Referring to FIG. 10, an access address for accessing the test region is generated (S42). The test region may be a region included in the memory device, based on the address information ADD_S, ADD_F received from the automatic test equipment. The test region may be a suspected defective region set by the automatic test equipment according to an embodiment, and may be address information of a wide region including a suspected defective region set by the automatic test equipment according to another embodiment.

The memory test apparatus may perform the test by executing the auto-operation of the test region on the basis of the direct access command (S43). The auto-operation may include auto-program/erase operation, auto-read operation, and auto-compare operation. The auto-program/erase operation may program the same preset data for each memory cell corresponding to the access address or erase the stored data. The auto-read operation may read the data stored in the memory cell corresponding to the access address and output it as output data. The auto-compare operation may compare the data read for each memory cell corresponding to the access address with the received target data and output the comparison result as pass/fail.

The direct access command may be an operation command that executes one of the auto-operations according to some embodiments, or may be at least two or more operation commands that determine the sequence in the auto-operations and execute them in order. The memory test apparatus may return the test result in which the FSM operation command or the direct access command is executed on the test region to the automatic test equipment (S50).

The test result may be whether the received command (Input Command) is pass/fail. According to some embodiments, the test results may include pass/fail, and address information of the failed memory cell in case of fail. The test result may further include output data according to a test operation according to some embodiments. Also, according to some embodiments, the test results may further include whether to debug and debugged address information.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A method of testing a memory device using a memory test apparatus, comprising:
   testing the memory device using a finite state machine (FSM) operation command, in response to a first test command received by the memory test apparatus; and
   performing an auto-operation test of a test region within the memory device, in response to a second test command and address information received by the memory test apparatus;
   wherein the memory test apparatus comprises a built-in self test (BIST) circuit configured to receive the first and second test commands as the FSM operation command and a direct access command, respectively;
wherein the BIST circuit comprises:
a test interface responsive to the first and second test commands;
a command FSM;
a direct access controller; and
a multiplexer configured to receive: (i) signals generated at an output(s) of the command FSM, (ii) signals generated at an output(s) of the direct access controller, (iii) data output from the memory device in response to the first test command, and (iv) data output from the memory device in response to the second test command; and
wherein the test interface is configured to receive the data output from the memory device in response to the second test command, but is not configured to receive data output from the memory device in response to the first test command.

2. The method of claim 1, wherein the memory device is responsive to signals generated by the multiplexer.

3. The method of claim 1, wherein the memory device comprises a main cell region and an option cell region; and wherein the FSM operation command includes at least one of a test procedure on the option cell region and a test procedure on the main cell region.

4. The method of claim 3, wherein the command FSM is configured to generate memory address information and at least one data pattern, which are provided to the memory device, in response to the FSM operation command.

5. The method of claim 4, wherein the test procedure on the main cell region includes at least one of:
executing an erase operation on at least one page or sector within the main cell region;
programming preset data into the main cell region;
reading data from the main cell region;
comparing the data read from the main cell region to target data; and
testing the main cell region with a data pattern or an inverted data pattern.

6. The method of claim 4, wherein the retention test procedure on the main cell region includes at least one of:
reading data from the main cell region;
comparing the data read from the main cell region to target data; and
testing the main cell region with a data pattern or an inverted data pattern.

7. A memory test apparatus, comprising:
a memory device; and
a built-in self test (BIST) module configured to access the memory device and execute a test therein, in response to a test command received from test equipment, said BIST module configured to generate an address within the memory responsive to a finite state machine (FSM) operation command, access the memory device and execute a test procedure within the memory device when the test command is the FSM operation command, and execute an auto-operation test on a test region of the memory device based on received address information when the test command is a direct access command;
wherein the BIST module comprises:
a command FSM module configured to execute at least one test procedure to access the memory device and execute a test procedure corresponding to the FSM operation command;
a direct access controller configured to execute the auto-operation test in accordance with the direct access command;
a multiplexer configured to receive signals generated at an output(s) of the command FSM module and signals generated at an output(s) of the direct access controller, and further configured to receive data output from the memory device in response to the test command received from the test equipment and selectively pass the data to the command FSM module and the direct access controller based on the test command; and
a test interface configured to selectively receive output data from the memory device via the direct access controller but not via the command FSM module.

8. The memory test apparatus of claim 7, wherein the command FSM module comprises:
a first address generator configured to generate an access address for accessing the memory device;
an operation module configured to program, read and/or erase a preset data pattern on a memory cell corresponding to the access address in accordance with the test procedure corresponding to the FSM operation command; and
a compare module configured to compare data read from the memory cell with target data and output whether a comparison result is pass/fail as the test result.

9. The memory test apparatus of claim 8, wherein when the comparison result is fail, the operation module executes debugging; and wherein the compare module compares data read from a debugged memory cell with target data and outputs whether the comparison result is pass/fail as the test result.

10. The memory test apparatus of claim 7, wherein the memory device includes a main cell region and an option cell region; and wherein the command FSM module is configured to perform a test procedure of the option cell region and a test procedure of the main cell region.

11. The memory test apparatus of claim 10, wherein the test procedure executes a first operation command on at least one cell included in the memory device, and executes a preset second operation command as a next operation on the basis of an execution result of the cell.

12. The memory test apparatus of claim 7, wherein the received address information includes a start address and an end address of the test region.

13. The memory test apparatus of claim 7, wherein the direct access controller comprises:
a second address generator which generates an access address on the test region on the basis of the received address information;
an auto-program/erase unit which programs same preset data for each memory cell corresponding to the access address or erases the stored data;
an auto-read unit which reads data stored in the memory cell corresponding to the access address; and
an auto-compare unit which compares data read for each memory cell corresponding to the access address with target data and outputs pass/fail as a comparison result.

14. A memory test apparatus connected between automatic test equipment and a memory device, comprising:
a test interface which receives a test command from the automatic test equipment and returns a test result; and
a built-in self test (BIST) module which accesses the memory device and executes a test,
the BIST module autonomously generates an address in accordance with a finite station machine (FSM) operation command, accesses the memory device, and executes a test procedure when the test command is the FSM operation command, and the BIST module executes an auto-operation test on a test region of the memory device on received address information when the test command is a direct access command;

wherein the BIST module includes:
 a command FSM module including at least one test procedure to access the memory device and execute a test procedure corresponding to the FSM operation command; and
 a direct access controller which executes the auto-operation test in accordance with the direct access command;

wherein the memory device provides output data to the command FSM module in response to the FSM operation command;

wherein the memory device provides output data to the direct access controller in response to the direct access command; and wherein the test interface receives the output data from the direct access controller in response to the access command, but does not receive the output data from the command FSM module in response to the FSM operation command.

15. The memory test apparatus of claim 14, wherein the command FSM module includes:
 a first address generator which autonomously generates an access address for accessing the memory device;
 an operation module which programs, reads or erases a preset data pattern on a memory cell corresponding to the access address in accordance with the test procedure corresponding to the FSM operation command; and
 a compare module which compares data read from the memory cell with target data and outputs whether a comparison result is pass/fail as the test result.

16. The memory test apparatus of claim 15, wherein when the comparison result is fail, the operation module executes debugging, and wherein the compare module compares data read from a debugged memory cell with target data and outputs whether the comparison result is pass/fail as the test result.

* * * * *